(12) United States Patent
Hatakeyama et al.

(10) Patent No.: US 6,866,983 B2
(45) Date of Patent: Mar. 15, 2005

(54) RESIST COMPOSITIONS AND PATTERNING PROCESS

(75) Inventors: Jun Hatakeyama, Niigata-ken (JP); Yuji Harada, Niigata-ken (JP); Yoshio Kawai, Niigata-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 101 days.

(21) Appl. No.: 10/406,222

(22) Filed: Apr. 4, 2003

(65) Prior Publication Data

US 2003/0194644 A1 Oct. 16, 2003

(30) Foreign Application Priority Data

Apr. 5, 2002 (JP) ........................................ 2002-103585

(51) Int. Cl.[7] ........................... G03F 7/039; G03F 7/004
(52) U.S. Cl. .................... 430/270.1; 430/907; 430/322; 430/330; 526/242
(58) Field of Search ............................. 430/270.1, 907, 430/322, 330; 526/242

(56) References Cited

U.S. PATENT DOCUMENTS

| 4,491,628 A | * | 1/1985 | Ito et al. | |
|---|---|---|---|---|
| 5,310,619 A | * | 5/1994 | Crivello et al. | |
| 2004/0013970 A1 | * | 1/2004 | Okada et al. | ............ 430/270.1 |

FOREIGN PATENT DOCUMENTS

| EP | 1365290 A1 | * | 11/2003 | ........... G03F/7/039 |
|---|---|---|---|---|
| EP | 1343047 A3 | * | 1/2004 | ........... G03F/7/004 |
| JP | 63-27829 A | * | 2/1988 | |
| JP | 2-27660 B2 | * | 6/1990 | |
| JP | 5-158239 A | * | 6/1993 | |
| JP | 5-214662 A | * | 9/1993 | |
| JP | 5-232706 P A | * | 9/1993 | |
| JP | 5-249683 P A | * | 9/1993 | |
| JP | 5-257282 A | * | 10/1993 | |
| JP | 5-289322 A | * | 11/1993 | |
| JP | 5-289340 A | * | 11/1993 | |
| JP | 9-73173 A | * | 3/1997 | |
| JP | 9-230595 A | * | 9/1997 | |
| JP | 10-10739 A | * | 1/1998 | |
| JP | 2001-146505 A | * | 8/2001 | |
| JP | 2001-233917 A | * | 8/2001 | |
| WO | WO 97/33198 A1 | * | 9/1997 | |
| WO | WO 2065212 A1 | * | 8/2002 | ........... G03F/7/039 |

OTHER PUBLICATIONS

Toriumi, M., et al., "fluoropolymer–based resists for a single resist process for 157 nm lithography", Nov./Dec. 2002, Journal of Vacuum Science Technology B 20(6), p. 2909–2912.*

Ito, Hiroshi et al, SPIE, 2001, vol. 4345, pp. 273–284.*

Kodama, Shun–ichi et al, SPIE, 2002, vol. 4690, pp. 76–83.*

* cited by examiner

Primary Examiner—Yvette C. Thornton
(74) Attorney, Agent, or Firm—Birch, Stewart, Kolasch & Birch, LLP

(57) ABSTRACT

A resist composition comprising a blend of a polymer comprising recurring units k and m of formula (1) wherein $R^1$ and $R^2$ each are hydrogen or an acid labile group, $0<k<1$, $0<m<1$ and $0<k+m\leq1$, and another polymer comprising recurring units having carboxyl groups whose hydrogen atoms are replaced by acid labile groups as a base resin forms a resist film which is improved in transparency, alkali dissolution contrast and plasma etching resistance.

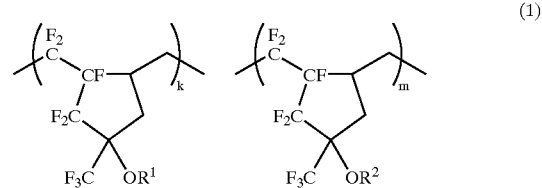

(1)

7 Claims, No Drawings

RESIST COMPOSITIONS AND PATTERNING PROCESS

This invention relates to resist compositions suited for microfabrication, especially chemical amplification resist compositions, and a patterning process using the same.

BACKGROUND OF THE INVENTION

In the drive for higher integration and operating speeds in LSI devices, the pattern rule is made drastically finer. The rapid advance toward finer pattern rules is grounded on the development of a projection lens with an increased NA, a resist material with improved performance, and exposure light of a shorter wavelength. To the demand for a resist material with a higher resolution and sensitivity, chemical amplification positive working resist materials which are catalyzed by acids generated upon light exposure are effective as disclosed in U.S. Pat. No. 4,491,628 and U.S. Pat. No. 5,310,619 (JP-B 2-27660 and JP-A 63-27829). They now become predominant resist materials especially adapted for deep UV lithography.

Also, the change-over from i-line (365 nm) to shorter wavelength KrF excimer laser (248 nm) brought about a significant innovation. Resist materials adapted for KrF excimer lasers enjoyed early use on the 0.30 micron process, passed through the 0.25 micron rule, and currently entered the mass production phase on the 0.18 micron rule. Engineers have started investigation on the 0.15 micron rule, with the trend toward a finer pattern rule being accelerated.

For ArF excimer laser (193 nm), it is expected to enable miniaturization of the design rule to 0.13 µm or less. Since conventionally used novolac resins and polyvinylphenol resins have very strong absorption in proximity to 193 nm, they cannot be used as the base resin for resists. To ensure transparency and dry etching resistance, some engineers investigated acrylic and alicyclic (typically cycloolefin) resins as disclosed in JP-A 9-73173, JP-A 10-10739, JP-A 9-230595 and WO 97/33198.

With respect to $F_2$ laser (157 nm) which is expected to enable further miniaturization to 0.10 µm or less, more difficulty arises in insuring transparency because it was found that acrylic resins which are used as the base resin for ArF are not transmissive to light at all and those cycloolefin resins having carbonyl bonds have strong absorption. It was also found that poly(vinyl phenol) which is used as the base resin for KrF has a window for absorption in proximity to 160 nm, so the transmittance is somewhat improved, but far below the practical level.

It was reported in Proc. SPIE Vol. 4345 p273 (2001), "Polymer design for 157 nm chemically amplified resists" that copolymers of tert-butyl α-trifluoromethylacrylate with 5-(2-hydroxy-2,2-bistrifluoromethyl)ethyl-2-norbornene and copolymers of tert-butyl α-trifluoromethylacrylate with 3-(hydroxybistrifluoromethyl)methylstyrene are appropriate resist polymers featuring high transparency and dry etching resistance. These polymers, however, have an absorbance of about 3. Only examples in which films of about 1,000 Å thick are patterned are reported therein. There is a need for further improvement in transmittance. It is generally believed that an absorbance of 2 or less is necessary to form a rectangular pattern at a film thickness of at least 2,000 Å. However, polymeric materials satisfying all the requirements of dry etching resistance, alkali solubility, substrate adherence and transparency have never been reported.

Furthermore, a highly transparent resin is described in Proc. SPIE Vol. 4690 p76 (2002), "Synthesis of novel fluoropolymers for 157 nm photoresists by cyclopolymerization." Owing to its absorbance of up to 1 and good substrate adherence, this resin is expected to find application at a film thickness of at least 2,000 Å. Since alcoholic groups are used as soluble groups, however, this resin has the drawback of a low dissolution rate in overexposed areas where acid-eliminatable groups have been eliminated. For increasing the dissolution rate in overexposed areas, it is contemplated effective to add a polymer which generates carboxylic acid upon acid elimination.

For example, the polymer platforms of four types proposed in the above-referred Proc. SPIE Vol. 4345 p273 (2001), "Polymer design for 157 nm chemically amplified resists" are polymers capable of carboxylic acid generation. Additionally, polyacrylates whose backbone is fluorinated and substituted with acid labile groups are proposed in JP-A 2001-233917.

SUMMARY OF THE INVENTION

An object of the invention is to provide a resist composition, especially a chemical amplification resist composition, having a high transmittance to vacuum UV radiation of up to 300 nm, especially ArF (193 nm), $F_2$ (157 nm), $Kr_2$ (146 nm), KrAr (134 nm) and $Ar_2$ (126 nm) excimer laser beams, as well as improved etching resistance. Another object is to provide a patterning process using the same.

It has been found that by blending a cyclic polymer (i) having alcoholic groups as soluble groups as represented by the general formula (1) with a polymer (ii) having carboxyl groups whose hydrogen atoms are replaced by acid labile groups, there is formulated a resist composition, especially a chemically amplified resist composition, capable of forming to a substantial thickness a patterned film having a very high transparency, a high dissolution contrast and a high aspect ratio.

In a first aspect, the present invention provides a resist composition comprising a polymer (i) comprising recurring units k and m of the following general formula (1) and another polymer (ii) comprising recurring units having carboxyl groups whose hydrogen atoms are replaced by acid labile groups.

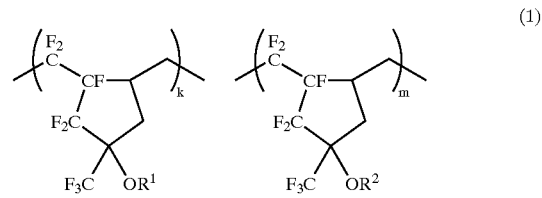

Herein $R^1$ and $R^2$ each are hydrogen or an acid labile group, k and m are numbers in the range: $0<k<1$, $0<m<1$ and $0<k+m\leq 1$.

Preferably, the recurring units having carboxyl groups whose hydrogen atoms are replaced by acid labile groups are recurring units p and/or q of the following general formula (2).

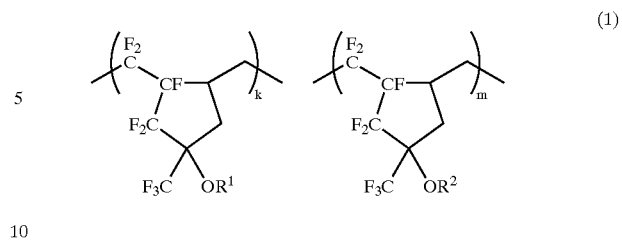

(1)

Herein $R^1$ and $R^2$ each are hydrogen or an acid labile group, k and m are numbers in the range: $0<k<1$, $0<m<1$ and $0<k+m\leq 1$.

The polymer (i) represented by formula (1) is highly transparent because of a high fluorine content and the absence of carbonyl and phenyl groups which cause absorption. In formula (1), k and m are numbers in the range: $0<k<1$ and $0<m<1$, and a proportion of k and m varies with polymerization conditions. Preferably, both k and m are in a range from 0.2 to 0.8. Each of $R^1$ and $R^2$ is hydrogen or an acid labile group. The degree of substitution of acid labile groups is preferably 3 to 50 mol %, especially 5 to 40 mol %, based on the total of $R^1$ and $R^2$.

The polymer (i) represented by formula (1) is obtained by polymerizing a monomer as shown below.

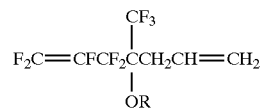

Herein R may be the same as $R^1$ and $R^2$, but is often a carbonylmethyl group. In the latter case, after polymerization, the carbonylmethyl group may be converted through alkaline hydrolysis to a hydrogen atom, which is then replaced by an acid labile group.

The polymerization of the above monomer is radical polymerization and more specifically, ring-closing polymerization where polymerization proceeds while forming rings. During ring formation, 5- and 6-membered rings are formed. The 6-membered rings include units m represented by formula (1) and optionally, recurring units n having the general formula (3).

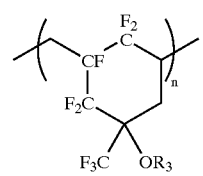

(3)

In formula (3), $R^3$ is hydrogen or an acid labile group as defined for $R^1$ and $R^2$, and $k+m+n=1$. The range of n is from 0 to 0.4.

In the other polymer (ii), the recurring units having carboxyl groups whose hydrogen atoms are replaced by acid labile groups are typically recurring units p and/or q of the following general formula (2).

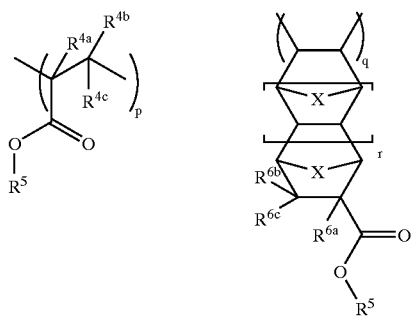

(2)

Herein each of $R^{4a}$, $R^{4b}$, $R^{4c}$, $R^{6a}$, $R^{6b}$ and $R^{6c}$ which may be the same or different is hydrogen, methyl, cyano, fluorine, or fluorinated alkyl having 1 to 4 carbon atoms, $R^5$ is an acid labile group, X is methylene, ethylene, oxygen atom or sulfur atom, and r is 0 or 1.

A preferred embodiment of the invention is a chemically amplified positive resist composition comprising (A) a blend of the two polymers defined above, (B) an organic solvent, and (C) a photoacid generator. The resist composition may further include (D) a basic compound and/or (E) a dissolution inhibitor.

In a second aspect, the present invention provides a process for forming a resist pattern, comprising the steps of applying the resist composition onto a substrate to form a coating; heat treating the coating and then exposing it to high-energy radiation having a wavelength of up to 300 nm through a photomask; and optionally heat treating the exposed coating and developing it with a developer. The high-energy radiation is typically an ArF, $F_2$ or $Ar_2$ laser beam or soft x-ray.

DESCRIPTION OF THE PREFERRED EMBODIMENTS

Polymers

For improving the transmittance in proximity to 157 nm, reducing the number of carbonyl groups and/or carbon-to-carbon double bonds is contemplated to be one effective way. It was also found that introducing fluorine atoms into base polymers makes a great contribution to improved transmittance. In fact, poly(vinyl phenol) having fluorine introduced in its aromatic rings provides an improved transmittance (see JP-A 2001-146505). However, this base polymer was found to turn to be negative upon exposure to high-energy radiation from an $F_2$ laser, interfering with its use as a practical resist. In contrast, those polymers obtained by introducing fluorine into acrylic resins or polymers containing in their backbone an alicyclic compound originating from a norbornene derivative were found to minimize absorption and eliminate the negative turning problem.

Using a polymer or high molecular weight compound (i) comprising recurring units k and m of the general formula (1) in combination with another polymer or high molecular weight compound (ii) comprising recurring units having carboxyl groups whose hydrogen atoms are replaced by acid labile groups, the present invention has succeeded in forming a patterned film having high transparency, a high dissolution contrast, and a high aspect ratio at an increased thickness.

(2)

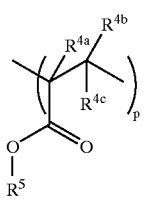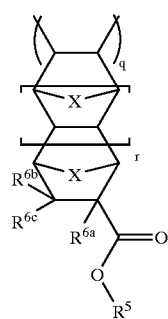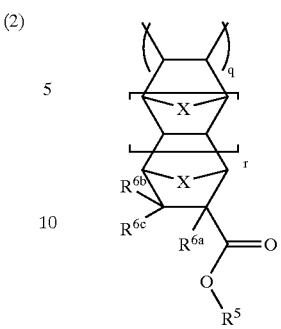

Herein each of $R^{4a}$, $R^{4b}$, $R^{4c}$, $R^{6a}$, $R^{6b}$ and $R^{6c}$ which may be the same or different is a hydrogen atom, methyl group, cyano group, fluorine atom, or fluorinated alkyl group having 1 to 4 carbon atoms, $R^5$ is an acid labile group, X is a methylene group, ethylene group, oxygen atom or sulfur atom, and r is 0 or 1.

Illustrative examples of the other polymer (ii) comprising such recurring units include those of the following formulae (2)-1 through (2)-4.

(2)-1

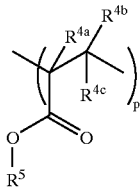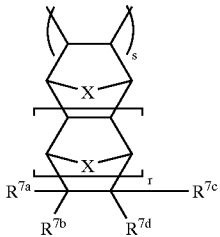

(2)-2

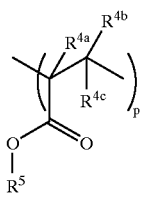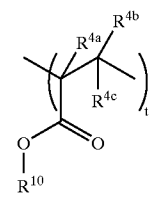

(2)-3

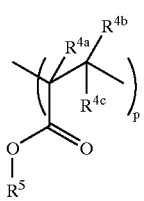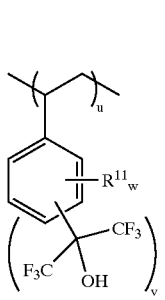

-continued (2)-4

In the recurring units s of formula (2)-1, each of $R^{7a}$, $R^{7b}$, $R^{7c}$ and $R^{7d}$ is hydrogen, hydroxyl, $-(CH_2)_eC(R^8)_2(OR^9)$, $-(CH_2)_eCO_2R^9$, or a straight, branched or cyclic alkyl or fluorinated alkyl group of 1 to 20 carbon atoms having a substituent group which may contain oxygen in the form of a hydroxyl group, ether bond or ester bond. $R^8$ is hydrogen, methyl, fluorine or a straight, branched or cyclic fluorinated alkyl group of 1 to 20 carbon atoms. The subscript e is an integer of 0 to 4. $R^9$ is hydrogen, an adhesive group, an acid labile group, or a straight, branched or cyclic fluorinated alkyl group of 1 to 20 carbon atoms. $R^{10}$ in formula (2)-2 is an adhesive group. $R^{11}$ in formula (2)-3 is a fluorine atom or trifluoromethyl group. The subscript w is an integer of 0 to 4, and v is 1 or 2.

In the polymers of formulae (2)-1 through (2)-4, recurring units x as shown below may be introduced for improving adhesion.

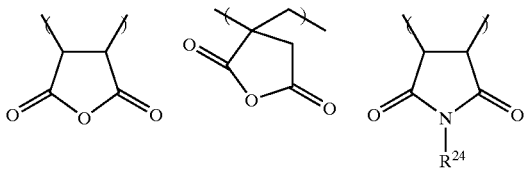

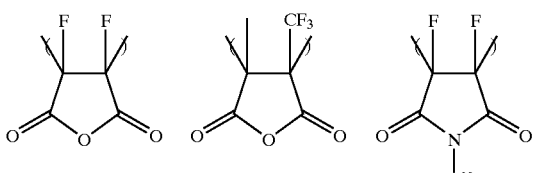

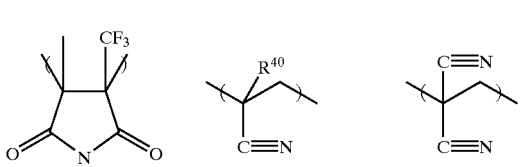

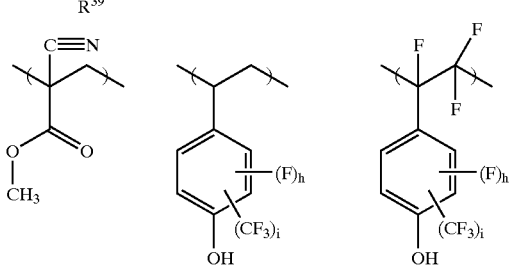

In the above formulae, $R^{24}$ is hydrogen, methyl, phenyl, p-hydroxyphenyl or hydroxyl; $R^{39}$ is hydrogen, methyl, phenyl, p-hydroxyphenyl or hydroxyl; $R^{40}$ is hydrogen or methyl; h is an integer of 0 to 4; and i is an integer of 0 to 4.

Further, norbornene derivative units y having adhesive groups as shown below may be copolymerized.

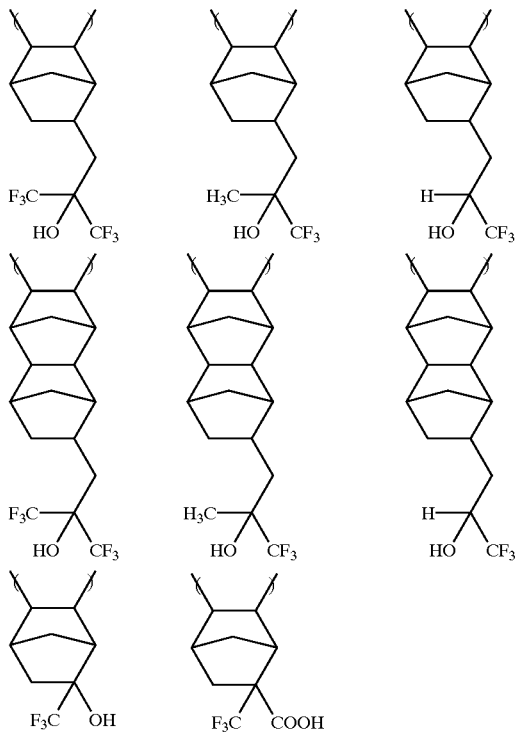

For improving transmittance, recurring units z as shown below may be copolymerized.

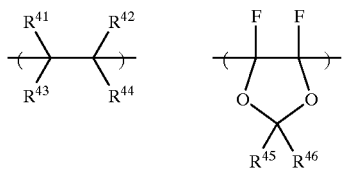

Herein, $R^{41}$ to $R^{44}$ each are fluorine, hydrogen, or a fluorinated alkyl group of 1 to 4 carbon atoms, and at least one of $R^{41}$ to $R^{44}$ contains at least one fluorine atom. $R^{45}$ and $R^{46}$ each are hydrogen, methyl or trifluoromethyl.

In the other polymer comprising recurring units of formula (2), the proportion of units p, q, s, t, u, x, y and z wherein p+q+s+t+u+x+y+z=U is such that p/U is from 0 to 0.9, q/U is from 0 to 0.9, p+q≠0 (i.e., p+q>0), each of s/U, t/U and u/U is from 0 to 0.7, and each of x/U, y/U and z/U is from 0 to 0.5.

In the foregoing formulae, suitable straight, branched or cyclic alkyl groups of 1 to 20 carbon atoms include methyl, ethyl, propyl, isopropyl, n-propyl, n-butyl, sec-butyl, tert-butyl, cyclopentyl, cyclohexyl, cyclohexylmethyl, 2-ethylhexyl, n-octyl, 1-adamantyl, and (2-adamantyl) methyl, with those groups of 1 to 12 carbon atoms, especially 1 to 10 carbon atoms being preferred.

The fluorinated alkyl groups correspond to the foregoing alkyl groups in which some or all of the hydrogen atoms are replaced by fluorine atoms. Examples include, but are not limited to, trifluoromethyl, 2,2,2-trifluoroethyl, 3,3,3-trifluoropropyl, 1,1,1,3,3,3-hexafluoroisopropyl, and 1,1,2,2,3,3,3-heptafluoropropyl.

The acid labile groups represented by $R^1$ to $R^3$, $R^5$ and $R^9$, which may be the same or different, are selected from a variety of such groups, preferably from tertiary hydrocarbon groups of 4 to 61 carbon atoms, more preferably 4 to 20 carbon atoms, represented by the following general formula (AL-1). Those groups having a cyclic structure are more effective for improving etching resistance. The cyclic structure may be either a monocyclic structure or a bridged cyclic structure which is effective for imparting more etching resistance. An acid-eliminatable group having a cyclic structure introduced therein is more elimination reactive and effective for improving contrast, that is, the gamma of dissolution.

(AL-1)

Herein $R^{15}$, $R^{16}$ and $R^{17}$ are each independently a straight, branched or cyclic hydrocarbon group of 1 to 20 carbon atoms while a bridged cyclic hydrocarbon group is also acceptable. A pair of $R^{15}$ and $R^{16}$, $R^{16}$ and $R^{17}$, or $R^{15}$ and $R^{17}$ may bond together to form a ring having a monocyclic structure or a bridged cyclic structure with the carbon atom to which they are attached.

Illustrative examples of suitable tertiary hydrocarbon groups are given below.

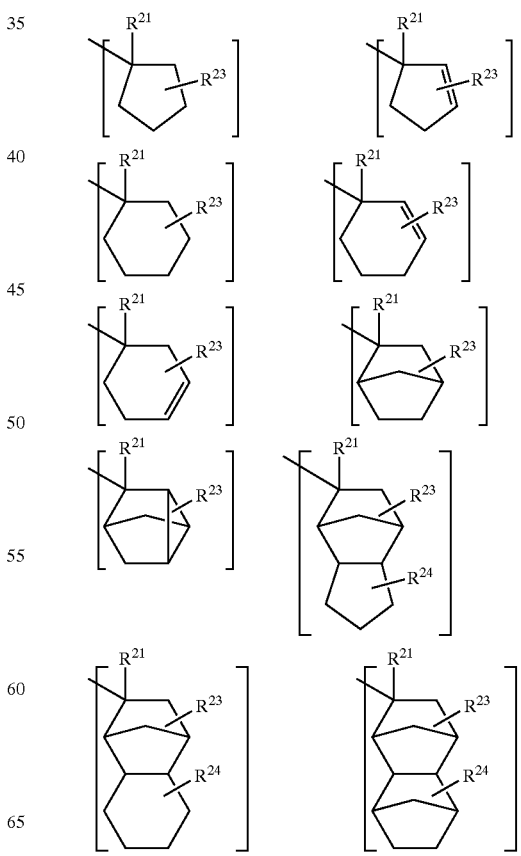

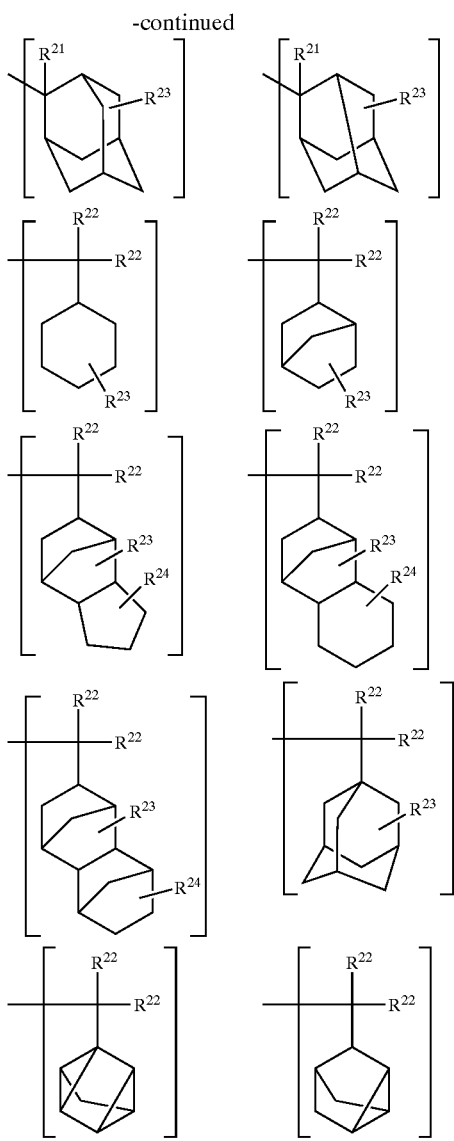

Herein, each of $R^{21}$ and $R^{22}$ is a monovalent hydrocarbon group of 1 to 6 carbon atoms which may contain a hetero atom. The hetero atom may be an oxygen atom, sulfur atom or nitrogen atom, and be contained or intervene in the form of —OH, —OR$^{25}$, —O—, —S—, —S(=O)—, —NH$_2$, —NHR$^{25}$, —N(R$^{25}$)$_2$, —NH— or —NR$^{25}$— wherein $R^{25}$ is a straight, branched or cyclic alkyl group of 1 to 10 carbon atoms. Illustrative examples of $R^{21}$ and $R^{22}$ include methyl, ethyl, propyl, isopropyl, n-butyl, sec-butyl, n-pentyl, n-hexyl, cyclopropyl, cyclopropylmethyl, cyclobutyl, cyclopentyl and cyclohexyl.

Each of $R^{23}$ and $R^{24}$ is hydrogen, a straight, branched or cyclic alkyl group, hydroxyalkyl, alkoxyalkyl or alkoxy group. Illustrative examples include methyl, hydroxymethyl, ethyl, hydroxyethyl, propyl, isopropyl, n-butyl, sec-butyl, n-pentyl, n-hexyl, methoxy, methoxymethoxy, ethoxy, and tert-butoxy.

Also useful are acid labile groups of the following general formula (AL-10) and (AL-11).

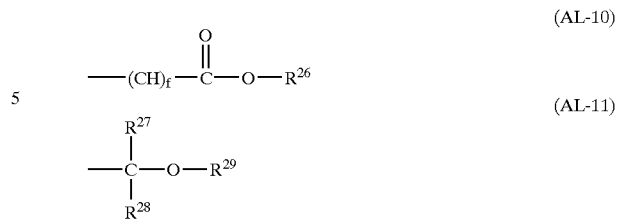

In formulae (AL-10) and (AL-11), each of $R^{26}$ and $R^{29}$ is a straight, branched or cyclic alkyl group of 1 to 61 carbon atoms, preferably 1 to 20 carbon atoms, which may contain a hetero atom such as oxygen, sulfur, nitrogen or fluorine. Each of $R^{27}$ and $R^{28}$ is hydrogen or a straight, branched or cyclic alkyl group of 1 to 20 carbon atoms which may contain a hetero atom such as oxygen, sulfur, nitrogen or fluorine. The subscript f is an integer of 0 to 10. A pair of $R^{27}$ and $R^{28}$, $R^{27}$ and $R^{29}$, or $R^{28}$ and $R^{29}$ may bond together to form a ring with the carbon and oxygen atoms to which they are attached.

Illustrative examples of the compound of formula (AL-10) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl, and 2-tetrahydrofuranyloxycarbonylmethyl as well as substituent groups of the following general formulae (AL-10)-1 through (AL-10)-9.

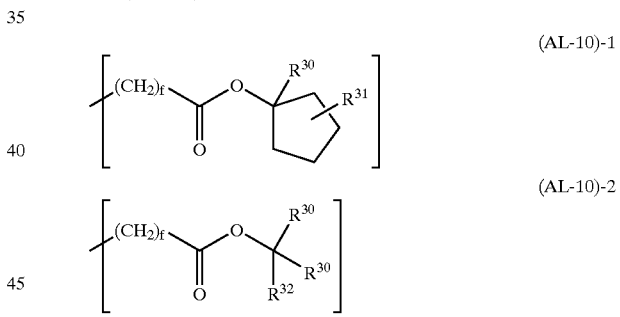

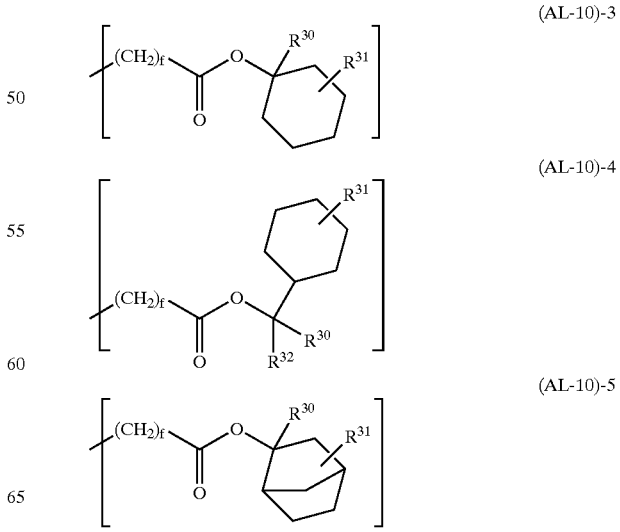

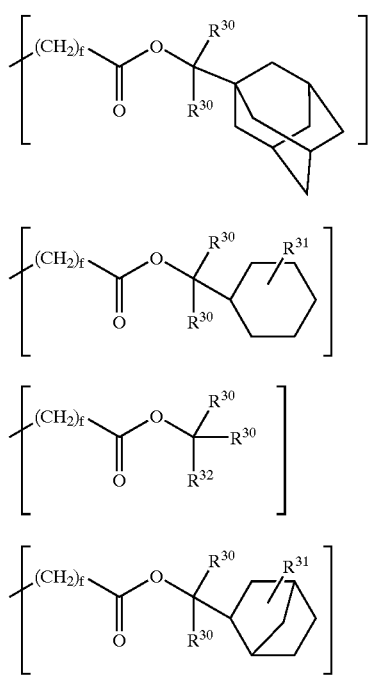

(AL-10)-6

(AL-10)-7

(AL-10)-8

(AL-10)-9

In formulae (AL-10)-1 through (AL-10)-9, $R^{30}$ which may be the same or different is a straight, branched or cyclic alkyl group of 1 to 8 carbon atoms, aryl group of 6 to 20 carbon atoms or aralkyl group; $R^{31}$ is hydrogen or a straight, branched or cyclic alkyl group of 1 to 20 carbon atoms; and $R^{32}$ is a straight, branched or cyclic alkyl group of 2 to 20 carbon atoms, aryl group of 6 to 20 carbon atoms or aralkyl group.

Illustrative examples of the acetal compound of formula (AL-11) include those of the following general formulae (AL-11)-1 through (AL-11)-23.

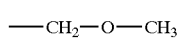 (AL-11)-1

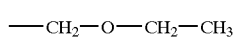 (AL-11)-2

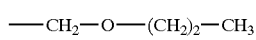 (AL-11)-3

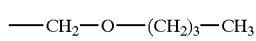 (AL-11)-4

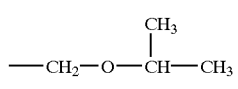 (AL-11)-5

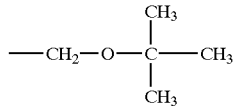 (AL-11)-6

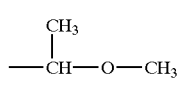 (AL-11)-7

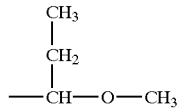 (AL-11)-8

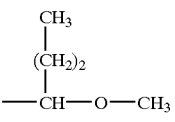 (AL-11)-9

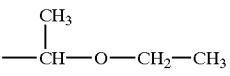 (AL-11)-10

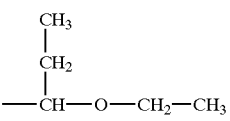 (AL-11)-11

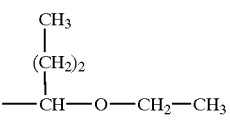 (AL-11)-12

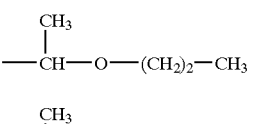 (AL-11)-13

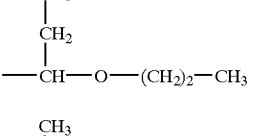 (AL-11)-14

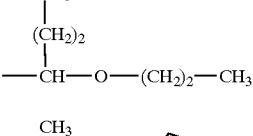 (AL-11)-15

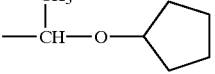 (AL-11)-16

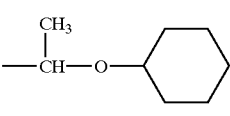 (AL-11)-17

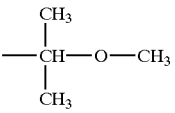 (AL-11)-18

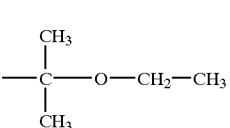 (AL-11)-19

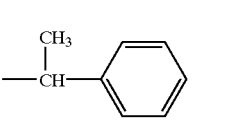 (AL-11)-20

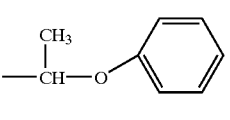 (AL-11)-21

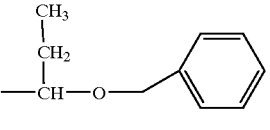 (AL-11)-22

(AL-11)-23

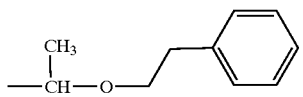

In an alternative embodiment, the polymer may be crosslinked within the molecule or between molecules with an acid labile group of the general formula (AL-11a) or (AL-11b).

(AL-11a)

(AL-11b)

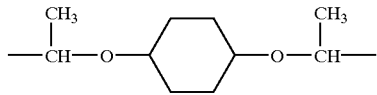

Herein $R^{33}$ and $R^{34}$ each are hydrogen or a straight, branched or cyclic alkyl group of 1 to 8 carbon atoms, or $R^{33}$ and $R^{34}$, taken together, may form a ring, and $R^{33}$ and $R^{34}$ are straight or branched alkylene groups of 1 to 8 carbon atoms when they form a ring; $R^{35}$ is a straight, branched or cyclic alkylene group of 1 to 10 carbon atoms; the subscripts g and h are 0 or integers of 1 to 10, and preferably 0 or integers of 1 to 5; i is an integer of 1 to 7; "A" is a (i+1)-valent aliphatic or alicyclic saturated hydrocarbon group, aromatic hydrocarbon group or heterocyclic group having 1 to 50 carbon atoms, which may be separated by a hetero atom or in which some of the hydrogen atoms attached to carbon atoms may be substituted with hydroxyl, carboxyl, carbonyl or fluorine; and B is —CO—O—, —NHCO—O— or —NHCONH—.

Preferably, "A" is selected from di- to tetra-valent straight, branched or cyclic alkylene groups of 1 to 20 carbon atoms, alkyltriyl groups, alkyltetrayl groups and arylene groups of 6 to 30 carbon atoms, which may be separated by a hetero atom and in which some of the hydrogen atoms attached to carbon atoms may be substituted with hydroxyl, carboxyl or acyl groups or halogen atoms. The subscript i is preferably an integer of 1 to 3.

The crosslinking acetal groups of formulae (AL-11a) and (AL-11b) are exemplified by the following formulae (AL-11)-24 through (AL-11)-31.

(AL-11)-24

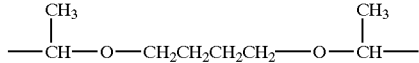

(AL-11)-25

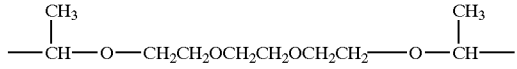

(AL-11)-26

(AL-11)-27

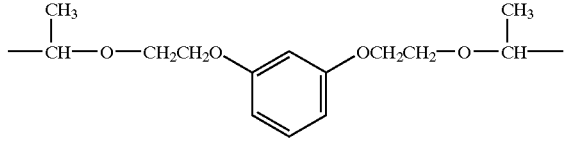

(AL-11)-28

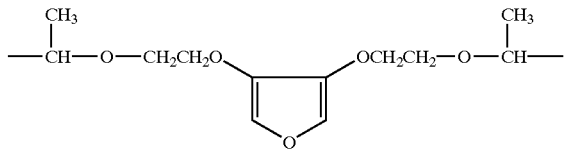

(AL-11)-29

(AL-11)-30

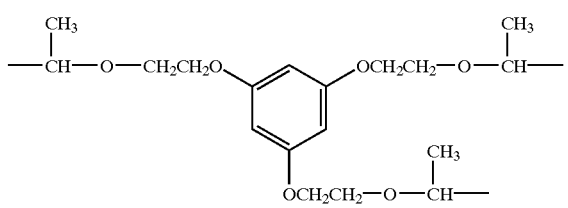

(AL-11)-31

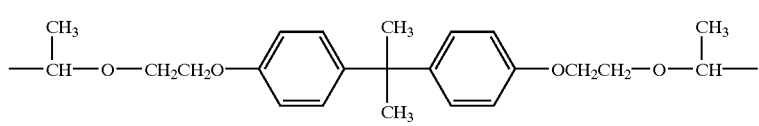

The adhesive groups represented by $R^9$ and $R^{10}$ are selected from a variety of such groups and preferably groups of the general formulae shown below.

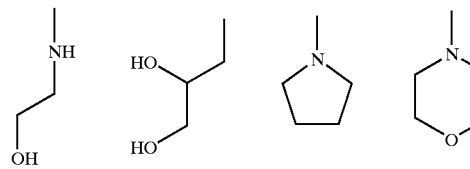

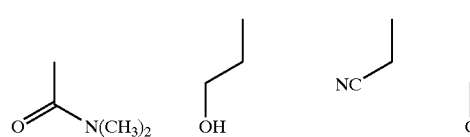

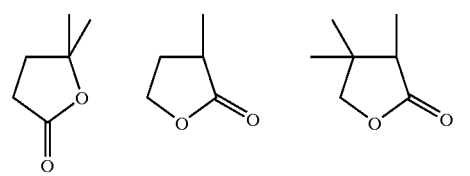

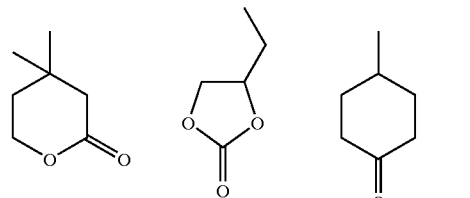

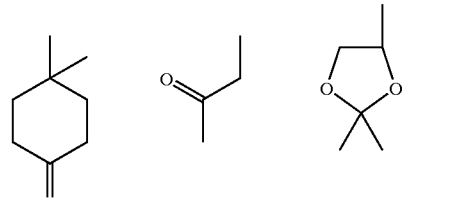

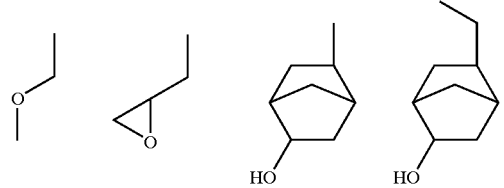

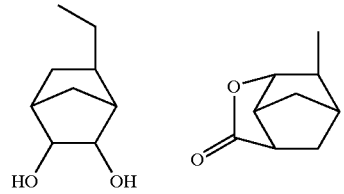

-continued

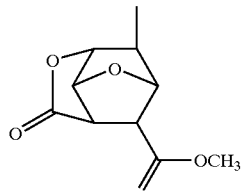

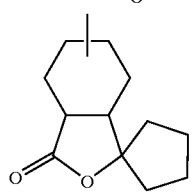

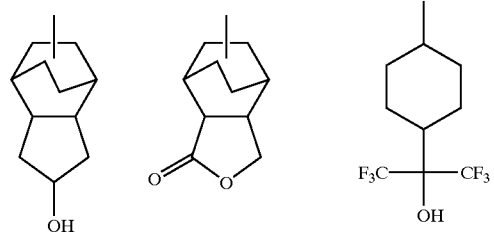

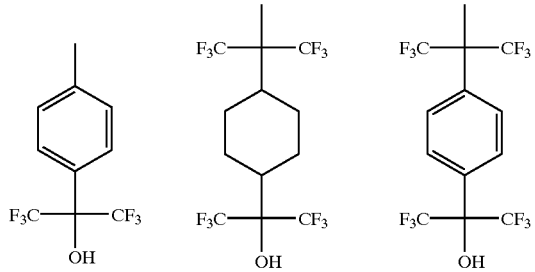

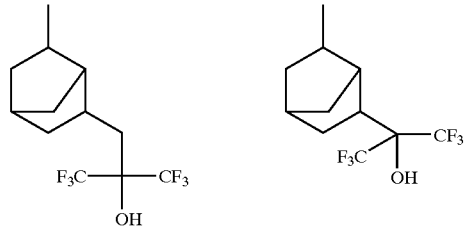

Preferably the polymers (i) and (ii) have a weight average molecular weight of about 1,000 to about 1,000,000, and more preferably about 2,000 to about 100,000. Each of the polymers (i) and (ii) used in blend may be a single polymer or a mixture of two or more polymers. The polymer (i) and the polymer (ii) are preferably blended in a weight ratio of from 0.3:0.7 to 0.9:0.1, and more preferably from 0.4:0.6 to 0.85:0.15.

The blend of the aforementioned polymers (i) and (ii) can be used as a base resin in resist compositions, specifically chemical amplification type resist compositions, and especially chemical amplification type positive working resist compositions. It is understood that the polymer blend of the invention may be admixed with an additional polymer for the purpose of altering the dynamic properties, thermal properties, alkali solubility and other physical properties of polymer film. The type of the additional polymer which can be admixed is not critical. Any of polymers known to be useful in resist use may be admixed in any desired proportion.

Resist Composition

As long as the polymer blend of the invention is used as a base resin, the resist composition of the invention may be prepared using well-known components. In a preferred embodiment, the chemically amplified positive resist composition is defined as comprising (A) the above-described polymer blend as a base resin, (B) an organic solvent, and (C) a photoacid generator. In the resist composition, there may be further formulated (D) a basic compound and/or (E) a dissolution inhibitor.

Component (B)

The organic solvent used as component (B) in the invention may be any organic solvent in which the base resin, photoacid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate.

Also useful are fluorinated organic solvents. Examples include 2-fluoroanisole, 3-fluoroanisole, 4-fluoroanisole, 2,3-difluoroanisole, 2,4-difluoroanisole, 2,5-difluoroanisole, 5,8-difluoro-1,4-benzodioxane, 2,3-difluorobenzyl alcohol, 1,3-difluoro-2-propanol, 2',4'-difluoropropiophenone, 2,4-difluorotoluene, trifluoroacetaldehyde ethyl hemiacetal, trifluoroacetamide, trifluoroethanol, 2,2,2-trifluoroethyl butyrate, ethyl heptafluorobutyrate, ethyl heptafluorobutylacetate, ethyl hexafluoroglutarylmethyl, ethyl 3-hydroxy-4,4,4-trifluorobutyrate, ethyl 2-methyl-4,4,4-trifluoroacetoacetate, ethyl pentafluorobenzoate, ethyl pentafluoropropionate, ethyl pentafluoropropynylacetate, ethyl perfluorooctanoate, ethyl 4,4,4-trifluoroacetoacetate, ethyl 4,4,4-trifluorobutyrate, ethyl 4,4,4-trifluorocrotonate, ethyl trifluorosulfonate, ethyl 3-(trifluoromethyl)butyrate, ethyl trifluoropyruvate, sec-ethyl trifluoroacetate, fluorocyclohexane, 2,2,3,3,4,4,4-heptafluoro-1-butanol, 1,1,1,2,2,3,3-heptafluoro-7,7-dimethyl-4,6-octanedione, 1,1,1,3,5,5,5-heptafluoropentane-2,4-dione, 3,3,4,4,5,5,5-heptafluoro-2-pentanol, 3,3,4,4,5,5,5-heptafluoro-2-pentanone, isopropyl 4,4,4-trifluoroacetoacetate, methyl perfluorodecanoate, methyl perfluoro(2-methyl-3-oxahexanoate), methyl perfluorononanoate, methyl perfluorooctanoate, methyl 2,3,3,3-tetrafluoropropionate, methyl trifluoroacetoacetate, 1,1,1,2,2,6,6,6-octafluoro-2,4-hexanedione, 2,2,3,3,4,4,5,5-octafluoro-1-pentanol, 1H,1H,2H,2H-perfluoro-1-decanol, perfluoro-2,5-dimethyl-3,6-dioxane anionic acid methyl ester, 2H-perfluoro-5-methyl-3,6-dioxanonane, 1H,1H,2H,3H,3H-perfluorononane-1,2-diol, 1H,1H,9H-perfluoro-1-nonanol, 1H,1H-perfluorooctanol, 1H,1H,2H,2H-perfluorooctanol, 2H-perfluoro-5,8,11,14-tetramethyl-3,6,9,12,15-pentaoxaoctadecane, perfluorotributylamine, perfluorotrihexylamine, methyl perfluoro-2,5,8-trimethyl-3,6,9-trioxadodecanoate, perfluorotripentylamine, perfluorotripropylamine, 1H,1H,2H,3H,3H-perfluoroundecane-1,2-diol, trifluorobutanol, 1,1,1-trifluoro-5-methyl-2,4-hexanedione, 1,1,1-trifluoro-2-propanol, 3,3,3-trifluoro-1-propanol, 1,1,1-trifluoro-2-propyl acetate, perfluorobutyltetrahydrofuran, perfluorodecalin, perfluoro(1,2-dimethylcyclohexane), perfluoro(1,3-dimethylcyclohexane), propylene glycol trifluoromethyl ether acetate, propylene glycol methyl ether trifluoromethyl acetate, butyl trifluoromethylacetate, methyl 3-trifluoromethoxypropionate, perfluorocyclohexanone, propylene glycol trifluoromethyl ether, butyl trifluoroacetate, and 1,1,1-trifluoro-5,5-dimethyl-2,4-hexanedione.

These solvents may be used alone or in combinations of two or more thereof. Of the above organic solvents, preferred are diethylene glycol dimethyl ether and 1-ethoxy-2-propanol, in which the photoacid generator is most soluble, and propylene glycol monomethyl ether acetate which is safe, and mixtures thereof.

The solvent is preferably used in an amount of about 300 to 10,000 parts by weight, more preferably about 500 to 5,000 parts by weight per 100 parts by weight of the base resin.

Component (C)

Suitable examples of the photoacid generator (C) include onium salts of formula (4) below, diazomethane derivatives of formula (5), glyoxime derivatives of formula (6), β-ketosulfone derivatives, disulfone derivatives, nitrobenzylsulfonate derivatives, sulfonic acid ester derivatives, and imidoyl sulfonate derivatives.

The onium salts used as the photoacid generator are of the general formula (4).

$$(R^{51})_i M^+ K^- \qquad (4)$$

In the formula, $R^{51}$ is a straight, branched or cyclic alkyl of 1 to 12 carbon atoms, an aryl of 6 to 20 carbon atoms, or an aralkyl of 7 to 12 carbon atoms; $M^+$ is iodonium or sulfonium; $K^-$ is a non-nucleophilic counter-ion; and the letter i is 2 or 3.

Illustrative examples of alkyl groups represented by $R^{51}$ include methyl, ethyl, propyl, butyl, pentyl, 2-oxocyclopentyl, norbornyl, and adamantyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary aralkyl groups include benzyl and phenethyl. Examples of the non-nucleophilic counter-ion represented by $K^-$ include halide ions such as chloride and bromide; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

Illustrative examples of the onium salts include diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl) phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl) sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoromethanesulfonate, ethylenebis[methyl(2-oxocyclopentyl)sulfonium trifluoromethanesulfonate], and 1,2'-naphthylcarbonylmethyltetrahydrothiophenium triflate.

The diazomethane derivatives used as the photoacid generator are of the general formula (5).

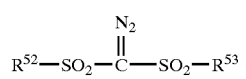

(5)

In the formula, $R^{52}$ and $R^{53}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms.

Illustrative examples of alkyl groups represented by $R^{52}$ and $R^{53}$ include methyl, ethyl, propyl, butyl, amyl, cyclopentyl, cyclohexyl, norbornyl, and adamantyl. Exemplary halogenated alkyl groups include trifluoromethyl, 2,2,2-trifluoroethyl, 2,2,2-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

Examples of the diazomethane derivatives include
bis(benzenesulfonyl)diazomethane,
bis(p-toluenesulfonyl)diazomethane,
bis(xylenesulfonyl)diazomethane,
bis(cyclohexylsulfonyl)diazomethane,
bis(cyclopentylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane,
bis(tert-butylsulfonyl)diazomethane,
bis(n-amylsulfonyl)diazomethane,
bis(isoamylsulfonyl)diazomethane,
bis(sec-amylsulfonyl)diazomethane,
bis(tert-amylsulfonyl)diazomethane,
1-cyclohexylsulfonyl-1-(tert-butylsulfonyl)diazomethane,
1-cyclohexylsulfonyl-1-(tert-amylsulfonyl)diazomethane, and
1-tert-amylsulfonyl-1-(tert-butylsulfonyl)diazomethane.

The glyoxime derivatives used as the photoacid generator are of the general formula (6).

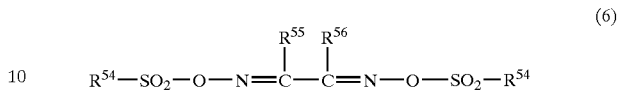

(6)

In the formula, $R^{54}$ to $R^{56}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms. $R^{55}$ and $R^{56}$ may together form a cyclic structure with the proviso that if they form a cyclic structure, each is a straight or branched alkylene group of 1 to 6 carbon atoms.

The alkyl, halogenated alkyl, aryl, halogenated aryl, and aralkyl groups represented by $R^{54}$ to $R^{56}$ are exemplified by the same groups as mentioned above for $R^{52}$ and $R^{53}$. Examples of alkylene groups represented by $R^{55}$ and $R^{56}$ include methylene, ethylene, propylene, butylene, and hexylene.

Examples of the glyoxime derivatives include
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(p-toluenesulfonyl)-2-methyl-3,4-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(n-butanesulfonyl)-2,3-pentanedioneglyoxime,
bis-O-(n-butanesulfonyl)-2-methyl-3,4-pentanedioneglyoxime,
bis-O-(methanesulfonyl)-α-dimethylglyoxime,
bis-O-(trifluoromethanesulfonyl)-α-dimethylglyoxime,
bis-O-(1,1,1-trifluoroethanesulfonyl)-α-dimethylglyoxime,
bis-O-(tert-butanesulfonyl)-α-dimethylglyoxime,
bis-O-(perfluorooctanesulfonyl)-α-dimethylglyoxime,
bis-O-(cyclohexanesulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-tert-butylbenzenesulfonyl)-α-dimethylglyoxime,
bis-O-(xylenesulfonyl)-α-dimethylglyoxime, and
bis-O-(camphorsulfonyl)-α-dimethylglyoxime.

Other useful photoacid generators include β-ketosulfone derivatives such as 2-cyclohexylcarbonyl-2-(p-toluenesulfonyl)propane and 2-isopropylcarbonyl-2-(p-toluenesulfonyl)propane; disulfone derivatives such as diphenyl disulfone and dicyclohexyl disulfone; nitrobenzyl sulfonate derivatives such as 2,6-dinitrobenzyl p-toluenesulfonate and 2,4-dinitrobenzyl p-toluenesulfonate; sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, and 5-norbornene-2,3-dicarboxyimidoyl n-butyltriflate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl)

sulfonium trifluoromethanesulfonate, triphenylsulfonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocylohexyl)sulfonium trifluoromethanesulfonate, and 1,2'-naphthylcarbonylmethyltetrahydrothiophenium triflate; diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane; and glyoxime derivatives such as bis-O-(p-toluenesulfonyl)-α-dimethylglyoxime and bis-O-(n-butanesulfonyl)-α-dimethylglyoxime. These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is preferably added in an amount of about 0.2 to 15 parts by weight per 100 parts by weight of the base resin. At less than 0.2 part, the amount of acid generated during exposure would be too small and the sensitivity and resolution be poor, whereas the addition of more than 15 parts would lower the transmittance of the resist and result in a poor resolution.

Component (D)

The basic compound used as component (D) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile. See JP-A 5-232706, 5-249683, 5-158239, 5-249662, 5-257282, 5-289322, and 5-289340.

Examples of suitable basic compounds include ammonia, primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives.

Examples of suitable primary aliphatic amines include methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable aromatic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene.

Examples of suitable heterocyclic amines include pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, nicotinic acid, and amino acid derivatives (e.g. alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine).

Examples of suitable sulfonyl group-bearing nitrogenous compounds include 3-pyridinesulfonic acid and pyridinium p-toluenesulfonate.

Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide.

Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (B)-1 may also be included alone or in admixture.

$$N(X)_n(Y)_{3-n} \quad \text{(B)-1}$$

In the formula, n is equal to 1, 2 or 3; the side chain Y is independently hydrogen or a straight, branched or cyclic alkyl group of 1 to 20 carbon atoms which may contain a hydroxyl group or ether; and the side chain X is independently selected from groups of the following general formulas (X)-1 to (X)-3, and two or three X's may bond together to form a ring.

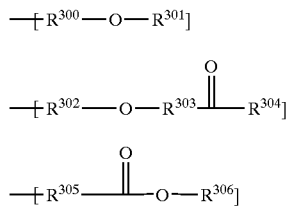

In the formulas, $R^{300}$, $R^{302}$ and $R^{305}$ are independently straight or branched alkylene groups of 1 to 4 carbon atoms; $R^{301}$ and $R^{304}$ are independently hydrogen or straight, branched or cyclic alkyl groups of 1 to 20 carbon atoms, which may contain one or more hydroxyl, ether, ester groups or lactone rings; $R^{303}$ is a single bond or a straight or branched alkylene group of 1 to 4 carbon atoms; and $R^{306}$ is a straight, branched or cyclic alkyl group of 1 to 20 carbon atoms which may contain one or more hydroxyl, ether, ester groups or lactone rings.

Illustrative examples of the compounds of formula (B)-1 include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}-amine, tris{2-(1-ethoxyethoxy)ethyl}amine, tris{2-(1-ethoxy-propoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]ethylamine, N,N-bis(2-acetoxyethyl)-2-[(methoxycarbonyl)methoxycarbonyl]ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

Also useful are one or more of cyclic structure-bearing basic compounds having the following general formula (B)-2.

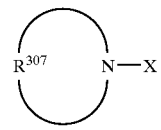

Herein X is as defined above, and $R^{307}$ is a straight or branched alkylene group of 2 to 20 carbon atoms which may contain one or more carbonyl, ether, ester or sulfide groups.

Illustrative examples of the cyclic structure-bearing basic compounds having formula (B)-2 include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, and 2-methoxyethyl morpholinoacetate.

Also, one or more of cyano-bearing basic compounds having the following general formulae (B)-3 to (B)-6 may be blended.

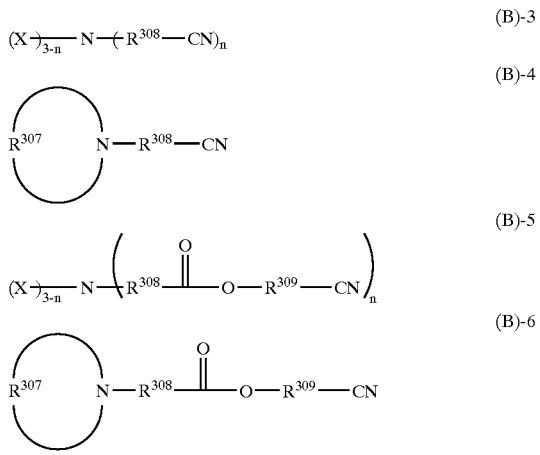

Herein, X, $R^{307}$ and n are as defined above, and $R^{308}$ and $R^{309}$ each are independently a straight or branched alkylene group of 1 to 4 carbon atoms.

Illustrative examples of the cyano-bearing basic compounds having formulae (B)-3 to (B)-6 include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-cyanomethyl-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

The basic compound is preferably formulated in an amount of 0.001 to 2 parts, and especially 0.01 to 1 part by weight, per 100 parts by weight of the base resin. Less than 0.001 part of the basic compound may fail to achieve the desired effects thereof, while the use of more than 2 parts would result in too low a sensitivity.

Component (E)

The dissolution inhibitor (E) is a compound with a molecular weight of up to 3,000 which changes its solubility in an alkaline developer under the action of an acid. Typically, a compound obtained by partially or entirely substituting acid labile groups for hydroxyl groups on a phenol or carboxylic acid derivative having a molecular weight of up to 2,500 is added as the dissolution inhibitor. The acid labile groups may be as exemplified for $R^5$ and may be the same as or different from $R^5$.

Examples of the phenol or carboxylic acid derivative having a molecular weight of up to 2,500 include 4,4'-(1-methylethylidene)bisphenol, (1,1'-biphenyl-4,4'-diol)-2,2'-methylenebis(4-methylphenol), 4,4-bis(4'-hydroxyphenyl) valeric acid, tris(4-hydroxyphenyl)methane, 1,1,1-tris(4'-hydroxyphenyl)ethane, 1,1,2-tris(4'-hydroxyphenyl)ethane, phenolphthalein, thimolphthalein, 3,3'-difluoro[(1,1'-biphenyl)-4,4'-diol], 3,3',5,5'-tetrafluoro[(1,1'-biphenyl)-4,4'-diol], 4,4'-[2,2,2-trifluoro-1-(trifluoromethyl)ethylidene] bisphenol, 4,4'-methylenebis(2-fluorophenol), 2,2'-methylenebis(4-fluorophenol), 4,4'-isopropylidenebis(2-fluorophenol), cyclohexylidenebis(2-fluorophenol), 4,4'-[(4-fluorophenyl)methylene]bis(2-fluorophenol), 4,4'-methylenebis(2,6-difluorophenol), 4,4'-(4-fluorophenyl) methylenebis(2,6-difluorophenol), 2,6-bis[(2-hydroxy-5-fluorophenyl)methyl]-4-fluorophenol, 2,6-bis[(4-hydroxy-3-fluorophenyl)methyl]-4-fluorophenol, and 2,4-bis[(3-hydroxy-4-hydroxyphenyl)methyl]-6-methylphenol. The acid labile substituents are the same as described above.

Illustrative, non-limiting, examples of the dissolution inhibitors which are useful herein include 3,3',5,5'-tetrafluoro[(1,1'-biphenyl)-4,4'-di-t-butoxycarbonyl], 4,4'-[2,2,2-trifluoro-1-(trifluoromethyl)ethylidene]bisphenol-4,4'-di-t-butoxycarbonyl, bis(4-(2'-tetrahydropyranyloxy) phenyl)methane, bis(4-(2'-tetrahydrofuranyloxy)phenyl) methane, bis(4-tert-butoxyphenyl)methane, bis(4-tert-butoxycarbonyloxyphenyl)methane, bis(4-tert-butoxycarbonylmethyloxyphenyl)methane, bis(4-(1'-ethoxyethoxy)phenyl)methane, bis(4-(1'-ethoxypropyloxy) phenyl)methane, 2,2-bis(4'-(2"-tetrahydropyranyloxy)) propane, 2,2-bis(4'-(2"-tetrahydrofuranyloxy)phenyl) propane, 2,2-bis(4'-tert-butoxyphenyl)propane, 2,2-bis(4'-tert-butoxycarbonyloxyphenyl)propane, 2,2-bis(4-tert-butoxycarbonylmethyloxyphenyl)propane, 2,2-bis(4'-(1"-ethoxyethoxy)phenyl)propane, 2,2-bis(4'-(1"-ethoxypropyloxy)phenyl)propane, tert-butyl 4,4-bis(4'-(2"-tetrahydropyranyloxy)phenyl)valerate, tert-butyl 4,4-bis(4'-(2"-tetrahydrofuranyloxy)phenyl)valerate, tert-butyl 4,4-bis (4'-tert-butoxyphenyl)valerate, tert-butyl 4,4-bis(4-tert-butoxycarbonyloxyphenyl)valerate, tert-butyl 4,4-bis(4'-tert-butoxycarbonylmethyloxyphenyl)valerate, tert-butyl 4,4-bis(4'-(1"-ethoxyethoxy)phenyl)valerate, tert-butyl 4,4-bis(4'-(1"-ethoxypropyloxy)phenyl)valerate, tris(4-(2'-tetrahydropyranyloxy)phenyl)methane, tris(4-(2'-tetrahydrofuranyloxy)phenyl)methane, tris(4-tert-butoxyphenyl)methane, tris(4-tert-butoxycarbonyloxyphenyl)methane, tris(4-tert-butoxycarbonyloxymethylphenyl)methane, tris(4-(1'-ethoxyethoxy)phenyl)methane, tris(4-(1'-ethoxypropyloxy) phenyl)methane, 1,1,2-tris(4'-(2"-tetrahydropyranyloxy) phenyl)ethane, 1,1,2-tris(4'-(2"-tetrahydrofuranyloxy) phenyl)ethane, 1,1,2-tris(4'-tert-butoxyphenyl)ethane, 1,1,2-tris(4'-tert-butoxycarbonyloxyphenyl)ethane, 1,1,2-tris(4'-tert-butoxycarbonylmethyloxyphenyl)ethane, 1,1,2-tris(4'-(1'-ethoxyethoxy)phenyl)ethane, 1,1,2-tris(4'-(1'-ethoxypropyloxy)phenyl)ethane, t-butyl 2-trifluoromethylbenzenecarboxylate, t-butyl 2-trifluoromethylcyclohexanecarboxylate, t-butyl decahydronaphthalene-2,6-dicarboxylate, t-butyl cholate, t-butyl deoxycholate, t-butyl adamantanecarboxylate, t-butyl adamantaneacetate, and tetra-t-butyl 1,1'-bicyclohexyl3,3',4,4'-tetracarboxylate.

In the resist composition according to the invention, an appropriate amount of the dissolution inhibitor (E) is up to about 20 parts, and especially up to about 15 parts by weight per 100 parts by weight of the base resin in the composition.

The resist composition of the invention may include optional ingredients, typically a surfactant which is commonly used for improving the coating characteristics. Optional ingredients may be added in conventional amounts so long as this does not compromise the objects of the invention.

A nonionic surfactant is preferred, examples of which include perfluoroalkyl polyoxyethylene ethanols, fluorinated alkyl esters, perfluoroalkylamine oxides, perfluoroalkyl EO-addition products, and fluorinated organosiloxane compounds. Illustrative examples include Florade FC-430 and FC-431 from Sumitomo 3M Ltd., Surflon S-141 and S-145 from Asahi Glass Co., Ltd., Unidyne DS-401, DS-403, and DS-451 from Daikin Industries Ltd., Megaface F-8151 from Dainippon Ink & Chemicals, Inc., and X-70-092 and X-70-093 from Shin-Etsu Chemical Co., Ltd. Preferred surfactants include Florade FC-430 from Sumitomo 3M Ltd. and X-70-093 from Shin-Etsu Chemical Co., Ltd.

Pattern formation using the resist composition of the invention may be carried out by a known lithographic technique. For example, the resist composition may be applied onto a substrate such as a silicon wafer by spin coating or the like to form a resist film having a thickness of 0.1 to 1.0 $\mu$m, preferably 0.2 to 0.3 $\mu$m, which is then pre-baked on a hot plate at 60 to 200° C. for 10 seconds to 10 minutes, and preferably at 80 to 150° C. for ½ to 5 minutes. A patterning mask having the desired pattern may then be placed over the resist film, and the film exposed through the mask to an electron beam or to high-energy radiation having a wavelength of up to 300 nm, such as deep-UV rays, excimer laser beams, or x-rays in a dose of about 1 to 200 mJ/cm$^2$, and preferably about 10 to 100 mJ/cm$^2$, then post-exposure baked (PEB) on a hot plate at 60 to 180° C. for 10 seconds to 5 minutes, and preferably at 80 to 150° C. for ½ to 3 minutes. Finally, development may be carried out using as the developer an aqueous alkali solution, such as 0.1 to 5%, and preferably 2 to 3%, tetramethylammonium hydroxide (TMAH), this being done by a conventional method such as dipping, puddling, or spraying for a period of 10 seconds to 3 minutes, and preferably 30 seconds to 2 minutes. These steps result in the formation of the desired pattern on the substrate. For suppressing the generation of standing waves from a narrow band excimer laser, an antireflection film may be provided between the substrate and the resist film or on the resist film. Of the various types of high-energy radiation that may be used, the resist composition of the invention is best suited to micro-pattern formation with, in particular, deep-UV rays having a wavelength of 254 to 120 nm, an excimer laser, especially ArF excimer laser (193 nm), $F_2$ excimer laser (157 nm), $Kr_2$ excimer laser (146 nm), KrAr excimer laser (134 nm) or $Ar_2$ excimer laser (126 nm), x-rays, or an electron beam. Recommended is exposure to an ArF, $F_2$ or $Ar_2$ laser beam or soft x-ray. The desired pattern may not be obtainable outside the upper and lower limits of the above range.

The resist composition comprising a blend of a polymer (i) of formula (1) which is sensitive to high-energy radiation and transparent at a wavelength of up to 200 nm, and another polymer (ii) which has an improved alkaline dissolution contrast as a base resin forms a resist film which is improved in transparency, alkali dissolution contrast and plasma etching resistance. These features of the inventive resist composition permit a finely defined pattern having sidewalls perpendicular to the substrate and a high aspect ratio to be easily be formed through exposure to a $F_2$ laser, making the resist ideal as a micropatterning material in VLSI fabrication.

EXAMPLE

Examples of the invention are given below by way of illustration and not by way of limitation.

Evaluation

Polymer Transmittance Measurement

Polymers 1–7 shown below and blends thereof (in a weight ratio as shown in Table 1) were determined for transmittance.

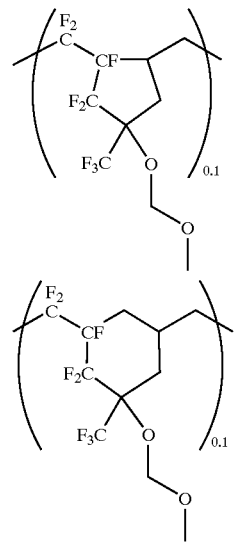

Polymer 1

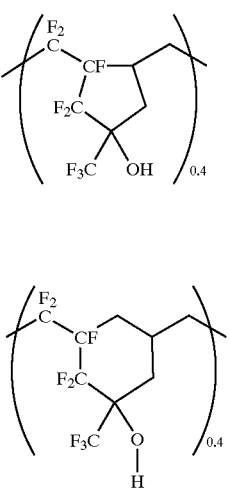

Polymer 2

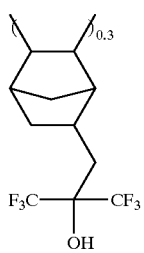

Polymer 3

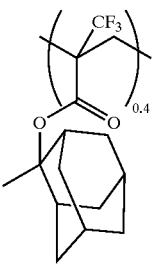

Polymer 4

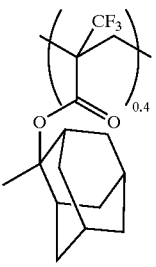

Polymer 5

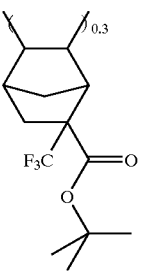

Polymer 6

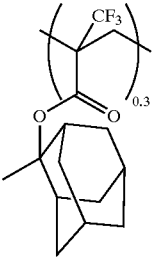

Polymer 7

Each polymer or polymer blend, 1 g, was thoroughly dissolved in 12 g of propylene glycol monomethyl ether acetate (PGMEA), and passed through a 0.2-μm Teflon® filter, obtaining a polymer solution. The polymer solution was spin coated onto a $MgF_2$ substrate and baked on a hot plate at 100° C. for 90 seconds, forming a polymer film of 200 nm thick on the substrate. Using a vacuum ultraviolet spectrometer (VUV-200S by Nihon Bunko K.K.), the polymer film was measured for transmittance at 248 nm, 193 nm and 157 nm. The results are shown in Table 1.

TABLE 1

| Polymer blend | Transmittance (%) | | |
|---|---|---|---|
| (weight ratio) | 248 nm | 193 nm | 157 nm |
| Polymer 1 + Polymer 2 (8:2) | 93 | 91 | 63 |
| Polymer 1 + Polymer 2 (6:4) | 93 | 90 | 55 |
| Polymer 1 + Polymer 3 (8:2) | 92 | 90 | 61 |
| Polymer 1 + Polymer 4 (8:2) | 92 | 42 | 57 |

TABLE 1-continued

| Polymer blend (weight ratio) | Transmittance (%) | | |
|---|---|---|---|
| | 248 nm | 193 nm | 157 nm |
| Polymer 1 + Polymer 5 (8:2) | 92 | 88 | 59 |
| Polymer 1 + Polymer 6 (8:2) | 92 | 92 | 61 |
| Polymer 1 + Polymer 7 (8:2) | 92 | 93 | 69 |
| Polymer 1 | 93 | 92 | 71 |
| Polymer 2 | 90 | 3 | 48 |
| Polymer 3 | 88 | 5 | 42 |
| Polymer 4 | 93 | 12 | 39 |
| Polymer 5 | 90 | 91 | 50 |
| Polymer 6 | 93 | 92 | 60 |

Resist Preparation and Exposure

Resist solutions were prepared in a conventional manner by formulating the polymer or polymer blend, photoacid generator (PAG1 or PAG2), basic compound, dissolution inhibitor (DRI1) and solvent in the amounts shown in Table 2. Note that the basic compounds used are tributylamine (TBA), trismethoxymethoxyethylamine (TMMEA), tris(2-acetoxyethyl)amine (AAA), and N,N-bis(2-acetoxyethyl)-3-aminopropiononitrile (AACN), and the solvent used is propylene glycol monomethyl ether acetate (PGMEA).

On silicon wafers having a film of DUV-30 (Brewer Science) coated to a thickness of 85 nm, the resist solutions were spin coated, then baked on a hot plate at 120° C. for 90 seconds to give resist films having a thickness of 200 nm. The resist films were exposed by means of an $F_2$ laser (VUVES-4500 Lithotec Japan Co., Ltd.) while varying the exposure dose. Immediately after exposure, the resist films were baked (PEB) at 120° C. for 90 seconds and then developed for 60 seconds with a 2.38% aqueous solution of tetramethylammonium hydroxide. The film thickness was measured in different dose areas. From the residual film thickness-to-dose relationship, the sensitivity (Eth) giving a film thickness 0 was determined. A γ value which was the slope (tan θ) of the characteristic curve was also determined. The results are shown in Table 2.

Separately, through a mask having a Cr pattern formed on a $MgF_2$ substrate, the resist film in close contact with the Cr pattern surface was exposed to a $F_2$ laser for effecting contact exposure. The exposure was followed by similar PEB and development, forming a pattern. A cross section of the pattern was observed under SEM, the ascertainable minimum pattern size giving a resolution.

TABLE 2

| Polymer (pbw) | Photoacid generator (pbw) | Basic compound (pbw) | Dissolution inhibitor (pbw) | Solvent (pbw) | Eth mJ/cm² | γ | Resolution (μm) |
|---|---|---|---|---|---|---|---|
| Polymer 1 (80) + Polymer 2 (20) | PAG1 (4) | TBA (0.1) | — | PGMEA (1000) | 18 | 9.6 | 0.12 |
| Polymer 1 (60) + Polymer 2 (40) | PAG1 (4) | TBA (0.1) | — | PGMEA (1000) | 23 | 9.4 | 0.14 |
| Polymer 1 (80) + Polymer 3 (20) | PAG1 (4) | TBA (0.1) | — | PGMEA (1000) | 22 | 12.8 | 0.12 |
| Polymer 1 (80) + Polymer 4 (20) | PAG1 (4) | TBA (0.1) | — | PGMEA (1000) | 7.3 | 8.8 | 0.13 |
| Polymer 1 (80) + Polymer 5 (20) | PAG1 (4) | TBA (0.1) | — | PGMEA (1000) | 18 | 10.6 | 0.12 |
| Polymer 1 (80) + Polymer 6 (20) | PAG1 (4) | TBA (0.1) | — | PGMEA (1000) | 28 | 10.3 | 0.13 |
| Polymer 1 (90) + Polymer 7 (10) | PAG1 (4) | TBA (0.1) | — | PGMEA (1000) | 26 | 9.5 | 0.13 |
| Polymer 1 (90) + Polymer 8 (10) | PAG1 (4) | TBA (0.1) | — | PGMEA (1000) | 22 | 12.8 | 0.12 |
| Polymer 1 (80) + Polymer 3 (20) | PAG1 (4) | TMMEA (0.1) | — | PGMEA (1000) | 18 | 12.5 | 0.12 |
| Polymer 1 (80) + Polymer 3 (20) | PAG1 (4) | AAA (0.1) | — | PGMEA (1000) | 22 | 13.5 | 0.11 |
| Polymer 1 (80) + Polymer 3 (20) | PAG1 (4) | AACN (0.1) | — | PGMEA (1000) | 28 | 20.9 | 0.11 |
| Polymer 1 (80) + Polymer 3 (20) | PAG1 (4) | TBA (0.1) | DRI1 (10) | PGMEA (1000) | 18 | 10.5 | 0.13 |
| Polymer 1 (80) + Polymer 3 (20) | PAG2 (4) | TBA (0.1) | — | PGMEA (1000) | 15 | 15.3 | 0.12 |

TABLE 3

| Polymer (pbw) | Photoacid generator (pbw) | Basic compound (pbw) | Dissolution inhibitor (pbw) | Solvent (pbw) | Eth mJ/cm² | γ | Resolution (μm) |
|---|---|---|---|---|---|---|---|
| Polymer 1 (100) | PAG1 (4) | TBA (0.1) | — | PGMEA (1000) | 8.5 | 6.3 | 0.16 |
| Polymer 2 (100) | PAG1 (4) | TBA (0.1) | — | PGMEA (1000) | 35 | 15.6 | 0.16 |
| Polymer 3 (100) | PAG1 (4) | TBA (0.1) | — | PGMEA (1000) | 20 | 12.3 | 0.17 |
| Polymer 4 (100) | PAG1 (4) | TBA (0.1) | — | PGMEA (1000) | 6.5 | 5.3 | 0.18 |
| Polymer 5 (100) | PAG1 (4) | TBA (0.1) | — | PGMEA (1000) | 23 | 12.8 | 0.16 |

TABLE 3-continued

| Polymer (pbw) | Photoacid generator (pbw) | Basic compound (pbw) | Dissolution inhibitor (pbw) | Solvent (pbw) | Eth mJ/cm$^2$ | γ | Resolution (μm) |
|---|---|---|---|---|---|---|---|
| Polymer 6 (100) | PAG1 (4) | TBA (0.1) | — | PGMEA (1000) | 12 | 7.3 | 0.18 |
| Polymer 7 (100) | PAG1 (4) | TBA (0.1) | — | PGMEA (1000) | 29 | 10.2 | 0.2 |

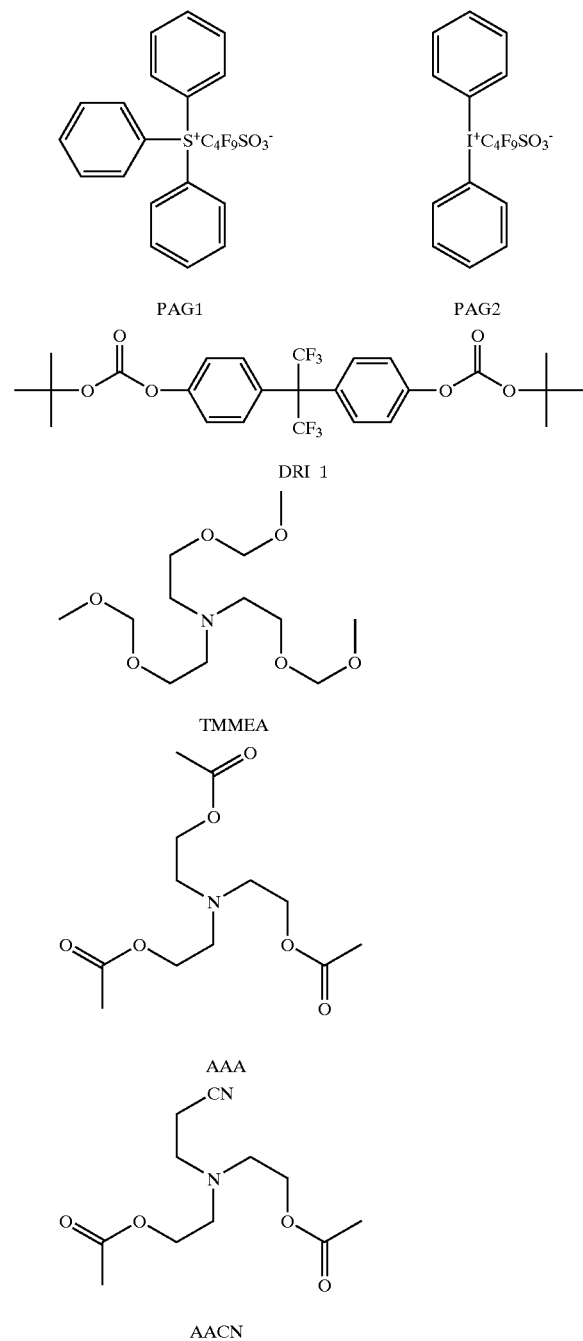

PAG1

PAG2

DRI 1

TMMEA

AAA

AACN

Dry Etching Test

Each polymer, 2 g, was thoroughly dissolved in 10 g of PGMEA, and passed through a 0.2-μm Teflon® filter, obtaining a polymer solution. The polymer solution was spin coated onto a silicon substrate and baked, forming a polymer film of 300 nm thick. Dry etching tests were carried out on the polymer films by etching them under two sets of conditions. The results are shown in Table 4.

(1) Etching Test with CHF$_3$/CF$_4$ Gas

Using a dry etching instrument TE-8500P (Tokyo Electron K.K.), the difference in polymer film thickness before and after etching was determined.

The etching conditions are given below.

| | |
|---|---|
| chamber pressure | 40.0 Pa |
| RF power | 1300 W |
| gap | 9 mm |
| CHF$_3$ gas flow rate | 30 ml/min |
| CF$_4$ gas flow rate | 30 ml/min |
| Ar gas flow rate | 100 ml/min |
| time | 30 sec |

(2) Etching Test with Cl$_2$/BCl$_3$ Gas

Using a dry etching instrument L-507D-L (Nichiden Anerba K.K.), the difference in polymer film thickness before and after etching was determined.

The etching conditions are given below.

| | |
|---|---|
| chamber pressure | 40.0 Pa |
| RF power | 300 W |
| gap | 9 mm |
| Cl$_2$ gas flow rate | 30 ml/min |
| BCl$_3$ gas flow rate | 30 ml/min |
| CHF$_3$ gas flow rate | 100 ml/min |
| O$_2$ gas flow rate | 2 ml/min |
| time | 30 sec |

TABLE 4

| Polymer blend (weight ratio) | CHF$_3$/CF$_4$ gas etching rate (nm/min) | Cl$_2$/BCl$_3$ gas etching rate (nm/min) |
|---|---|---|
| Polymer 1 + Polymer (8:2) | 220 | 288 |
| Polymer 1 + Polymer 2 (6:4) | 193 | 245 |
| Polymer 1 + Polymer 3 (8:2) | 177 | 203 |
| Polymer 1 + Polymer 4 (8:2) | 152 | 166 |
| Polymer 1 + Polymer 5 (8:2) | 206 | 277 |
| Polymer 1 + Polymer 6 (8:2) | 185 | 185 |
| Polymer 1 + Polymer 7 (8:2) | 196 | 206 |
| Polymer 1 | 280 | 350 |

As is evident from the above results, resist compositions using polymer blends within the scope of the invention have a high transparency at the wavelength (157 nm) of the F$_2$ laser. It is also confirmed that upon exposure to VUV, these resist compositions exert the positive working effect that the film thickness decreases with an increasing exposure dose as well as a high γ value and high contrast. They also exhibit a high resolution upon contact exposure and excellent resistance to dry etching.

Japanese Patent Application No. 2002-103585 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A resist composition comprising a polymer (i) comprising recurring units k and m of the following general formula (1):

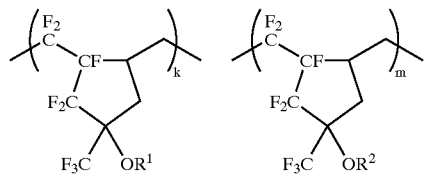

wherein $R^1$ and $R^2$ each are hydrogen or an acid labile group, k and m are numbers in the range: $0<k<1$, $0<m<1$ and $0<k+m \leq 1$, and another polymer (ii) comprising recurring units having carboxyl groups whose hydrogen atoms are replaced by acid labile groups.

2. The resist composition of claim 1 wherein the recurring units having carboxyl groups whose hydrogen atoms are replaced by acid labile groups are recurring units p and/or q of the following general formula (2):

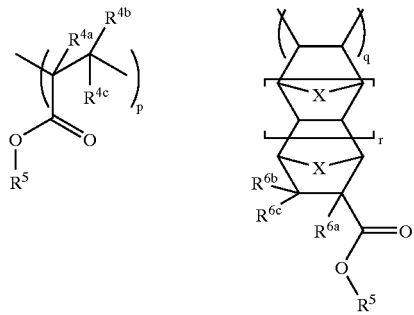

wherein each of $R^{4a}$, $R^{4b}$, $R^{4c}$, $R^{6a}$, $R^{6b}$ and $R^{6c}$ which may be the same or different is hydrogen, methyl, cyano, fluorine, or fluorinated alkyl having 1 to 4 carbon atoms, $R^5$ is an acid labile group, X is methylene, ethylene, oxygen atom or sulfur atom, and r is 0 or 1.

3. A chemically amplified positive resist composition comprising
    (A) a blend of the polymers (i) and (ii) set forth in claim 1,
    (B) an organic solvent, and
    (C) a photoacid generator.

4. The resist composition of claim 3, further comprising (D) a basic compound.

5. The resist composition of claim 3, further comprising (E) a dissolution inhibitor.

6. A process for forming a resist pattern comprising the steps of:
    applying the resist composition of claim 3 onto a substrate to form a coating,
    heat treating the coating and then exposing it to high-energy radiation having a wavelength of up to 300 nm through a photomask, and
    optionally heat treating the exposed coating and developing it with a developer.

7. The pattern forming process of claim 6 wherein the high-energy radiation is a ArF, $F_2$ or $Ar_2$ laser beam or soft x-ray.

* * * * *